(12) United States Patent
Greene et al.

(10) Patent No.: US 7,542,330 B2
(45) Date of Patent: Jun. 2, 2009

(54) SRAM WITH ASYMMETRICAL PASS GATES

(75) Inventors: Brian Joseph Greene, Yorktown Heights, NY (US); Chun-Yung Sung, Poughkeepsie, NY (US); Clement Wann, Carmel, NY (US); Robert Chi-Foon Wong, Poughkeepsie, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/763,555

(22) Filed: Jun. 15, 2007

(65) Prior Publication Data

US 2008/0310212 A1    Dec. 18, 2008

(51) Int. Cl.
*G11C 11/00* (2006.01)
(52) U.S. Cl. ........................ 365/154; 365/156

(58) Field of Classification Search ................ 365/154, 365/156, 230.05
See application file for complete search history.

(56) References Cited

U.S. PATENT DOCUMENTS

| 5,790,452 | A  * | 8/1998 | Lien ........................... 365/154 |
| 6,341,083 | B1   | 1/2002 | Wong |
| 6,549,453 | B2   | 4/2003 | Wong |
| 6,936,522 | B2   | 8/2005 | Steegen et al. |
| 7,362,606 | B2 * | 4/2008 | Chuang et al. .............. 365/154 |

* cited by examiner

*Primary Examiner*—Anh Phung
(74) *Attorney, Agent, or Firm*—Schmeiser, Olsen & Watts; Robert M. Trepp

(57) ABSTRACT

An SRAM having asymmetrical FET pass gates and a method of fabricating an SRAM having asymmetrical FET pass gates. The pass gates are asymmetrical with respect to current conduction from the drain to the source of the pass gate being different from current conduction from the source to the drain of the pass gate.

20 Claims, 5 Drawing Sheets

SRAM WITH ASYMMETRICAL PASS GATES

FIELD OF THE INVENTION

The present invention relates to the field of static random access memories (SRAMs); more specifically, it relates to an SRAM having asymmetrical pass gates.

BACKGROUND OF THE INVENTION

Because of high speed and low latency, SRAMs are often used as cache memories, control stores, buffer memories, instruction pipelines and data pipelines including input output interfaces and buffers for direct memory access ("DMA") interfaces within microprocessors as well as for data storage used for communication interfaces, e.g., network adapter buffers. As the size and operating voltages of these devices decrease so does the size and operating voltage of the field effect transistors (FETs) in the cells of SRAM arrays. As the size and voltages decreases it has become increasingly more difficult to maintain specified operational margins of SRAMs. Accordingly, there exists a need in the art to maintain specified operational margins of SRAMs.

SUMMARY OF THE INVENTION

A first aspect of the present invention is a static random access memory (SRAM) cell, comprising: a first p-channel field effect transistor (PFET) and a second PFET, the sources of the first and second PFETs connected to a high voltage terminal of a power source of a power supply, a drain of the first PFET connected to a first node, a drain of the second of second PFET connected to a second node, a gate of the first PFET connected to the second node and a gate of the second PFET connected to the first node; a first n-channel field effect transistor (NFET) and a second NFET, the sources of the first and second NFETs connected to a low voltage terminal of the power source, a drain of the first NFET connected to the first node, a drain of the second NFET connected to the second node, a gate of the first NFET connected to the second node and a gate of the second NFET connected to the first node; and a first field effect transistor (FET) pass gate and a second FET pass gate, a drain of the first FET pass gate connected to the first node and a drain of the second FET pass gate connected to the second node; a source of the first FET pass gate connected to a first bitline and a gate of the second FET pass gate connected to second bitline, gates of the first and second FET pass gates connected to a wordline, current conduction from the source to the drain of the first FET pass gate being different from current conduction from the drain to the source of the first FET pass gate and current conduction from the source to the drain of the second FET pass gate being different from current conduction from the drain to the source of the second FET pass gate.

A second aspect of the present invention is a method of reducing access disturb margin in a static random access memory (SRAM) cell, comprising: forming a first p-channel field effect transistor (PFET) and a second PFET, the sources of the first and second PFETs connected to a high voltage terminal of a power source of a power supply, a drain of the first PFET connected to a first node, a drain of the second of second PFET connected to a second node, a gate of the first PFET connected to the second node and a gate of the second PFET connected to the first node; forming a first n-channel field effect transistor (NFET) and a second NFET, the sources of the first and second NFETs connected to a low voltage terminal of the power source, a drain of the first NFET connected to the first node, a drain of the second NFET connected to the second node, a gate of the first NFET connected to the second node and a gate of the second NFET connected to the first node; forming a first field effect transistor (FET) pass gate and a second FET pass gate, a drain of the first FET pass gate connected to the first node and a drain of the second FET pass gate connected to the second node; a source of the first FET pass gate connected to a first bitline and a gate of the second FET pass gate connected to second bitline, gates of the first and second FET pass gates connected to a wordline; and adjusting current conduction from the drain to the source of the first FET pass gate to be greater than current conduction from the source to the drain of the first FET pass gate and adjusting current conduction from the drain to the source of the second FET pass gate to be greater than current conduction from the source to the drain of the second FET pass gate.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
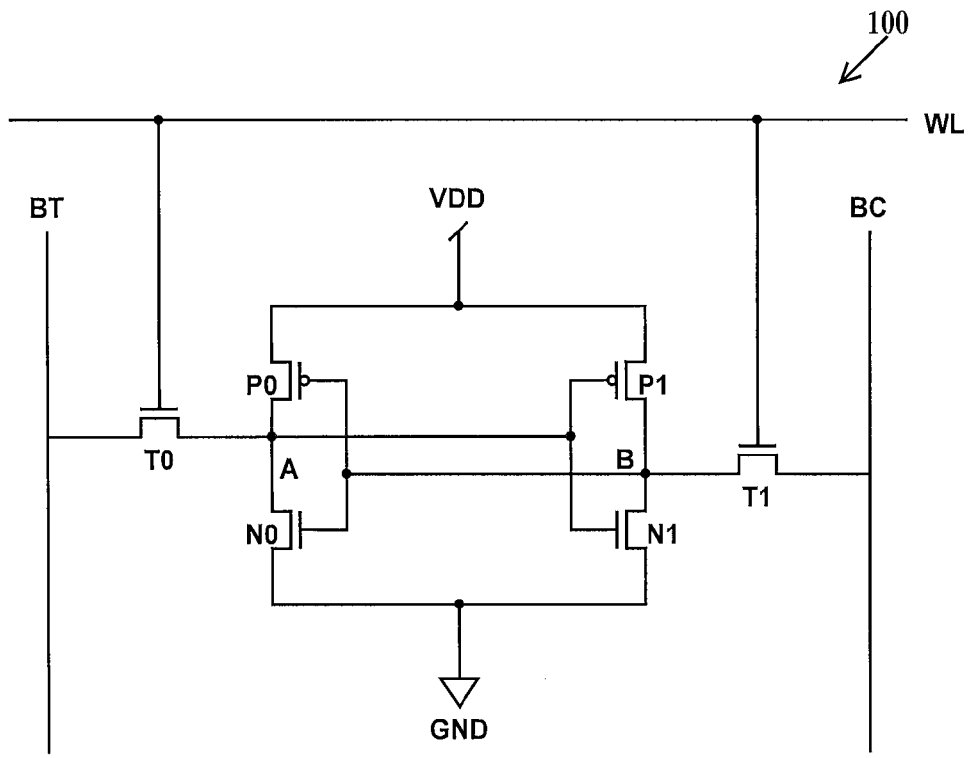
FIG. 1 is a related art SRAM cell.

FIG. 1 is a related art SRAM cell. In FIG. 1, an SRAM cell 100 comprises pass gate n-channel FETs (NFETs) T0 and T1, NFETs N0 and N1 and PFETs P0 and P1. The sources of PFETs P0 and P1 are connected to VDD and the drains of PFETs P0 and P1 to nodes A and B respectively. The sources of NFETs N0 and N1 are connected to GND and the drains of NFETs N0 and N1 to nodes A and B respectively. The gates of PFET P0 and NFET N0 are connected to node B and the gates of PFET P1 and NFET N1 are connected to node A. The drain of NFET T0 is connected to node A, the source of NFET T0 is connected to a bitline true (BT) line and the gate of NFET T0 is connected to a wordline WL. The drain of NFET T1 is connected to node B, the source of NFET T1 is connected to a bitline complement (BC) line and the gate of NFET T1 is connected to wordline WL. The physical structure of NFETs T0 and T1 are illustrated in FIG. 2 and described infra.

In an SRAM array, an array of cells SRAM cells 100 would be arranged in rows and columns. There would be multiple wordlines and multiple BT/BC line pairs. All SRAM cells in a same column would be connected to the same BT and BC lines and all SRAM cells in a same row would be connected to a same wordline. BT and BC lines are normally biased to VDD and would be selectively left floating during read access or connectable to VDD at one end and to GND at the opposite end during write operation.

Figure 2:
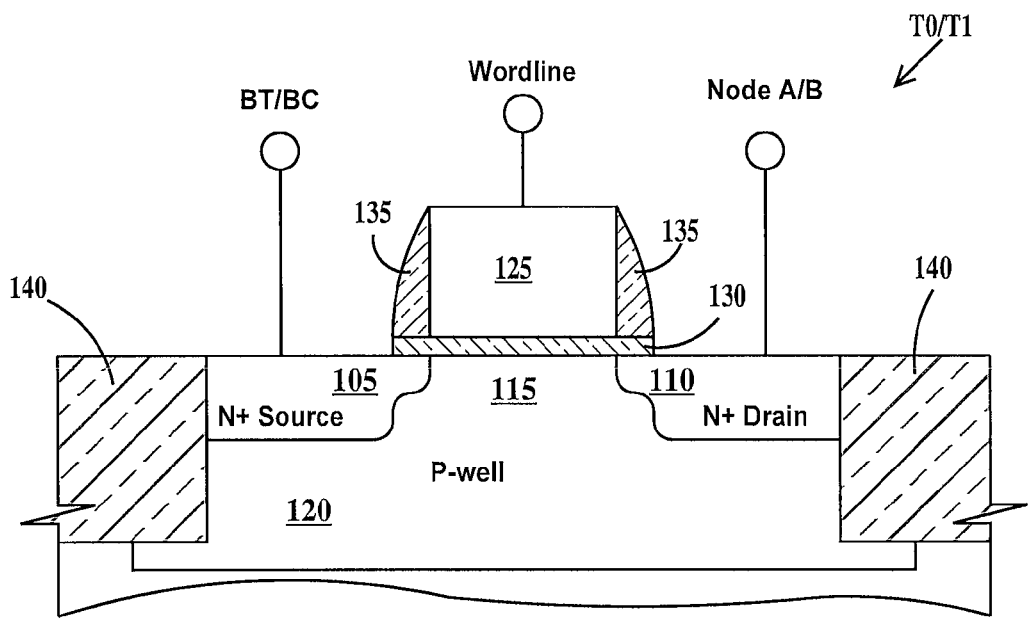
FIG. 2 is a related art pass gate FET as illustrated in FIG. 1.

FIG. 2 is a related art pass gate FET as illustrated in FIG. 1. In FIG. 2, NFET T0/T1 comprise an N-type source 105 and a N-type drain separated by a channel region 115, all formed in a P-well 120. A gate (e.g. polysilicon or other metal or semiconductor) is positioned over channel region 115 and separated from the channel region by a gate dielectric layer 130. Dielectric spacers 135 are formed on opposite sidewalls of gate 125 and over source 105 and drain 110. NFET T0/T1 is surrounded by and electrically isolated by dielectric isolation 140, sidewalls of dielectric isolation 140 abutting sidewalls of source 105 and drain 110. P-well 120 and dielectric isolation 140 are formed in a single crystal silicon substrate. In one example, dielectric isolation is $SiO_2$. The connections to BT/BC lines, the wordline and nodes A and B are also illustrated.

Returning to FIG. 1, two margins are of particular concern in SRAM cell 100, the access disturb margin (ADM) and the write margin (WRM). ADM is the likelihood that the state of a bit stored in an SRAM cell will change from one state to another when the cell is accessed during a read or a write operation. Bitlines are normally kept at VDD when not being accessed. To access a particular cell in an array, a wordline is brought to VDD and the bitlines are read or written to. To write a "1" to a cell, bitline BT is brought to VDD, bitline BC to ground (GND). To write a "0" to a cell and bitline BT is brought to GND and bitline BC to VDD.

In an example of an access disturb, with a "0" stored on node A and a "1" stored on node B, PFET P1 and NFET N0 are on and PFET P0 and NFET N1 are off. When NFET T0 is turned on, a current Isd (source to drain current) flows from bitline through NFET T0 to node A. If node A is disturbed above the trip point of the inverter formed by PFET P1 and NFET N1, PFET P1 will turn off, NFET N1 will turn on and node B will be pulled to GND and the cell data will be lost. The magnitude of the access disturb is proportional to Isd.

Figure 3:
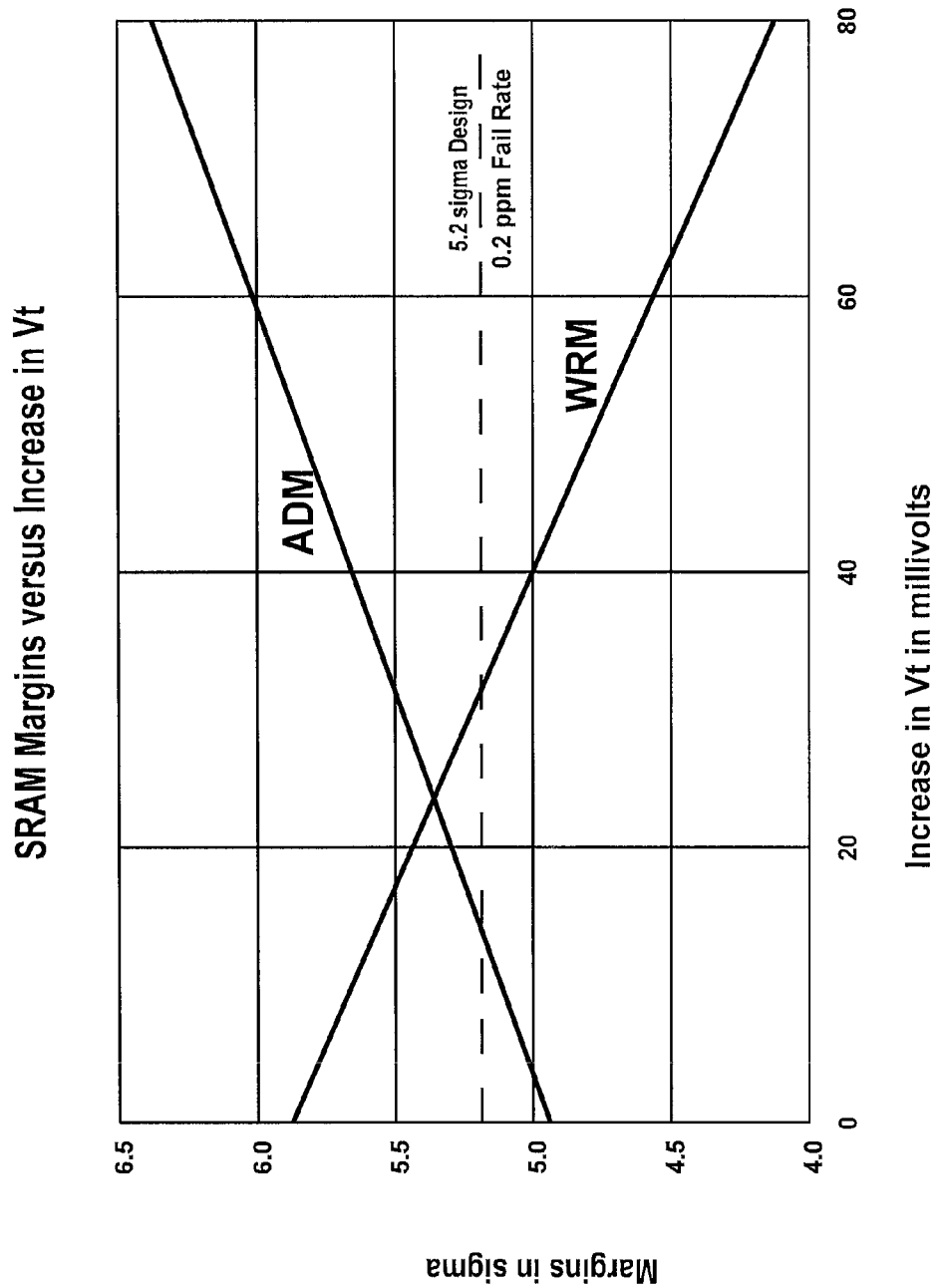
FIG. 3 is a plot illustrating SRAM margins in the SRAM cell of FIG. 1.

In an example of write, with a "0" stored on node A and a "1" stored on node B, bitline BC is brought to ground and node B is pulled to ground by a current flow Ids from node B through NFET T1 to bitline BC. The write operation is much less sensitive to the pull up of node A by current Isd through NFET T0 because the highest voltage on the drain of NFET T0 is VDD—the threshold voltage (Vt) of NFET T0. NFETs T0 and T1 are essentially identical devices with Isd=Ids (drain to source current). Identical devices are defined as devices that are identically designed and physically within tolerance specification of the fabrication process used to fabricate the devices. The conventional method of increasing ADM of an SRAM cell is to weaken the pass gate by increasing the Vt of the pass gates (e.g. by channel and halo ion implants as is well known in the art). However, since a write is essentially a "full" disturb that flips the cell to the intended state, a more stable cell is less writeable. This tradeoff is shown in FIG. 3 and described infra. Further, increasing the Vt of NFETs T0 and T1 slows down the write operation of SRAM cell 100 and is in itself often undesirable.

FIG. 3 is a plot illustrating SRAM margins in the SRAM cell of FIG. 1. In FIG. 3, ADM and WRM are plotted as a function of increasing Vt from a nominal value of zero to 80 mV in NFETs that are otherwise identical except for Vt. ADM increases with Vt while WRM decreases with Vt. Assuming an SRAM has a failure rate specification 0.2 ppm (less than 1 stability/write fail per 5 megabits). The nominal NFET (0 mV increase in Vt) has an ADM of about 5 sigma or about 0.57 stability fails per 1 megabit. The ADM and WRM to support this is 5.2 sigma. (the dashed line). Increasing the Vt by 50 mV the ADM increases to about 5.9 sigma but the WRM decreases to about 4.8 sigma. There is a small window between about 15 mV and 30 mV where both ADM and WRM are above 5.2 sigma, however when operating temperature and VDD ranges are taken into account, it is difficult to tune the SRAM using Vt adjustment for the entire VDD/temperature/Vt space to meet both ADM and WRM as shown by Table I:

TABLE I

| Vt | VDD | Temp | | | | | | | | |
| | | 125° C. | | 85° C. | | | | 25° C. | | |
| | | 0.6 V | 0.7 V | 0.8 V | 0.6 V | 0.7 V | 0.8 V | 0.6 V | 0.7 V | 0.8 V |
|---|---|---|---|---|---|---|---|---|---|---|
| Nominal | ADM | 4.2 | 5.0 | 5.4 | 4.5 | 5.4 | 5.8 | 4.9 | 5.9 | 6.4 |
| | WRM | 4.9 | 5.8 | 6.5 | 4.6 | 5.5 | 6.1 | 4.2 | 5.1 | 5.6 |
| +50 mV | ADM | 5.0 | 5.9 | 6.4 | 5.2 | 6.2 | 6.7 | 5.5 | 6.6 | 7.2 |
| | WRM | 3.8 | 4.8 | 5.4 | 3.5 | 4.5 | 5.1 | 3.1 | 4.0 | 4.6 |
| +80 mV | ADM | 5.4 | 6.4 | 6.9 | 5.6 | 6.6 | 7.2 | 5.9 | 7.0 | 7.6 |
| | WRM | 3.2 | 4.2 | 4.8 | 2.9 | 3.9 | 4.5 | 2.5 | 3.4 | 4.0 |

AMD and WRM in sigma

Figure 4:
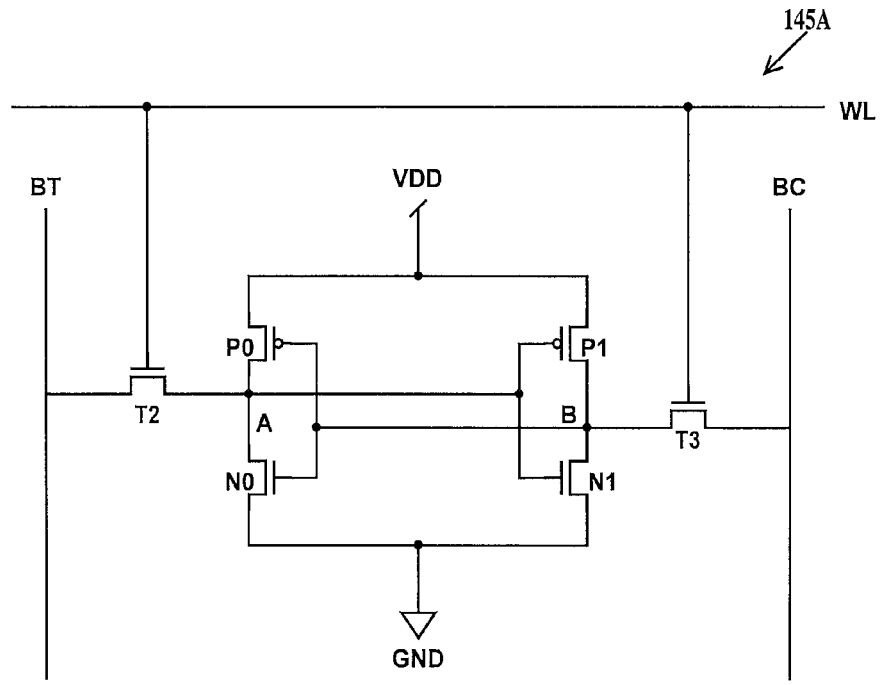
FIG. 4 is an SRAM cell having a first type of pass gate FET according to the present invention.

FIG. 4 is an SRAM cell having a first type of pass gate FET according to the present invention. In FIG. 4, an SRAM cell 145A is similar to SRAM cell 100 of FIG. 1 except pass gates NFETs T0 and T1 are replaced with pass gate NFETs T2 and T3. Both NFETs T2 and T3 are essentially identical and both have an Ids>Isd, in others words, NFETs T2 and T3 are asymmetrical devices as far as current conduction is concerned.

Figure 5:
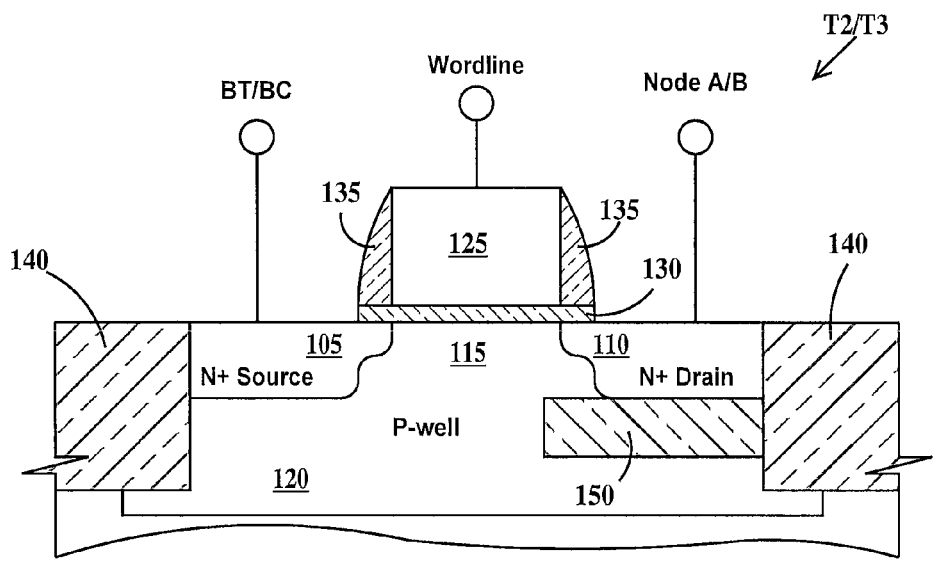
FIG. 5 is a cross-sectional view of the pass gate FETs of FIG. 4.

FIG. 5 is a cross-sectional view of the pass gate FETs of FIG. 4. In FIG. 5, NFETs T2/T3 are to NFETs T0 and T1 of FIG. 2 except a lateral buried dielectric layer 150 is formed under drain 110 but not under source 105. Buried lateral dielectric layer 150 extends from a sidewall of dielectric isolation 140 under drain 110 parallel to a top surface of the drain and in contact with a bottom surface of the drain. While lateral buried dielectric layer 150 is illustrated as extending under channel 115, the buried dielectric layer may not extend to the under source 105. Buried dielectric layer may extend only under a portion of channel 115. The presence of lateral buried dielectric layer 150 puts compressive stress on drain 110 and decreases the electron mobility in drain 110 thus increasing Ids compared to the Ids of a nominal device without the buried dielectric plate (i.e. NFETs T0 and T1 of FIG. 1). The presence of lateral buried dielectric layer 150 away from source 105 but in P-well 120 tends to put the source under tensile stress, increasing electron mobility in source 105 and decreasing Isd compared to the Isd of a nominal device without the lateral buried dielectric layer (i.e. NFETs T0 and T1 of FIG. 1). The compressive stress on the drain may be further increased by implanting germanium (Ge) into the drain but not into the source. Therefore there are three options to generate an asymmetrical NFET (or PFET) having Ids>Isd: (1) forming a buried dielectric layer under the drain; (2) implanting Ge into the drain; and (3) both forming a lateral buried dielectric layer under the drain and implanting Ge into the drain.

In one example, buried dielectric layer 150 comprises spin-on-glass, tetraethoxysilane (TEOS) chemical-vapor-deposition (CVD) glass, high-density plasma (HDP) oxide, or combinations of layers thereof. Formation of laterally extending buried dielectric layers is described in U.S. Pat. No. 6,936,522 to Steegen et al. and is hereby included by reference in its entirety.

Figure 6:
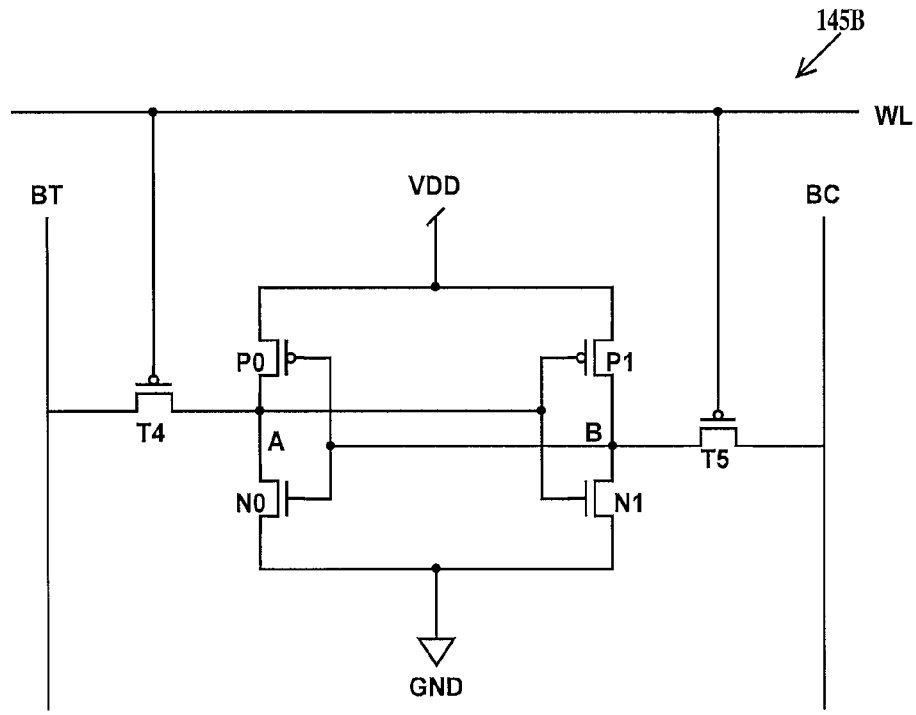
FIG. 6 is an SRAM cell having a second type of pass gate FET according to the present invention.

FIG. 6 is an SRAM cell having a second type of pass gate FET according to the present invention. In FIG. 6, an SRAM cell 145B is similar to SRAM cell 145A of FIG. 4 except NFETs T2 and T3 of FIG. 4 are replaced with PFET pass gates T4 and T5. Both PFETs T4 and T5 are essentially identical and both have an Ids>Isd, in others words, PFETs T4 and T5 are asymmetrical devices. A SRAM using PFET pass gates is described in U.S. Pat. No. 6,549,453 to Wong and is hereby included by reference in its entirety.

Figure 7:
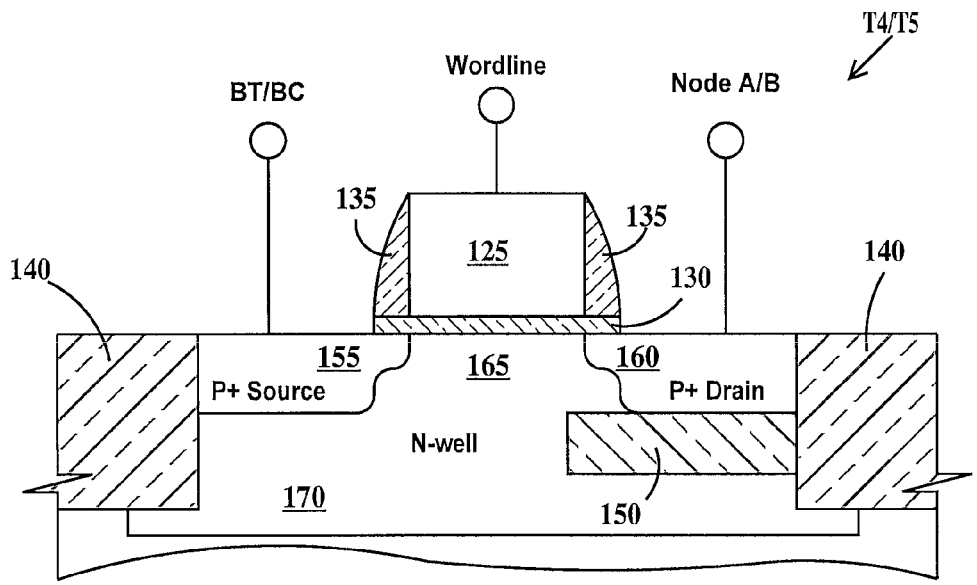
FIG. 7 is a cross-sectional view of the pass gate FETs of FIG. 6.

FIG. 7 is a cross-sectional view of the pass gate FETs of FIG. 6. In FIG. 7, NFETs T4/T5 are to NFETs T2 and T3 of FIG. 5 except P-doped source 155 replaces source 105 of FIG. 5, p-doped drain 160 replaces drain 110 of FIG. 5, channel 165 replaces channel 115 of FIG. 5 and N-well 170 replaces P-well 120. Buried lateral dielectric layer 150 extends from a sidewall of dielectric isolation 140 under drain 160 parallel to a top surface of the drain and in contact with a bottom surface of the drain but does not extend under source 155. While lateral buried dielectric layer 150 is illustrated as extending under channel 165, the buried dielectric layer may not extend to the source side 155. Buried dielectric layer 150 may extend only under a portion of the channel 165. The presence of lateral buried dielectric layer 150 puts compressive stress on drain 160 and increases the hole mobility thus increasing Ids compared to the Ids of a nominal device without the buried dielectric plate. The presence of lateral buried dielectric layer 150 away from source 155 but in N-well 170 tends to put the source under tensile stress decreasing hole mobility in the source and thus decreasing Isd compared to the Isd of a nominal device without the lateral buried dielectric layer. The compressive stress on the drain may be further increased by implanting germanium (Ge) into the drain. Therefore there are three options to generate an asymmetrical PFET having Ids>Isd: (1) forming a buried dielectric layer under the drain; (2) implanting Ge into the drain; and (3) both forming a lateral buried dielectric layer under the drain and implanting Ge into the drain.

Figure 8:
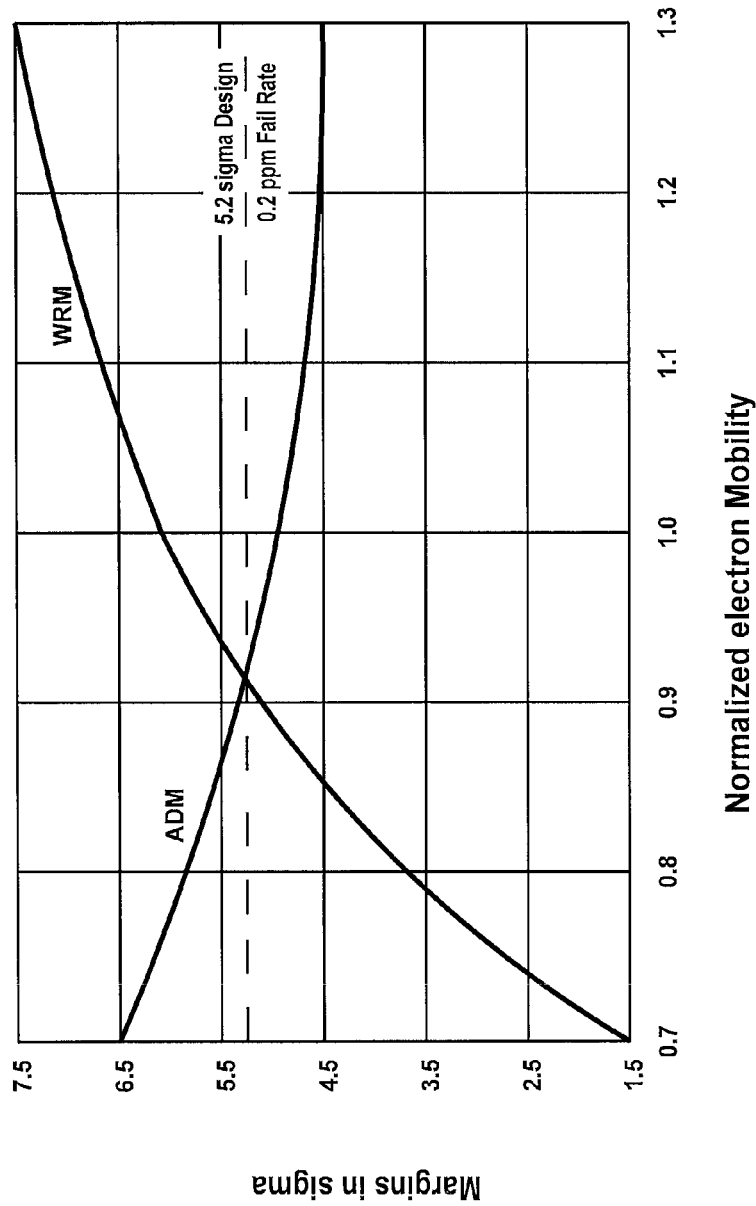
FIG. 8 is a plot of SRAM margins as a function of NFET pass gate carrier mobility.

FIG. 8 is a plot of SRAM margins as a function of NFET pass gate carrier mobility. In FIG. 8, ADM and WRM are plotted versus normalized electron mobility. In FIG. 8, lowering Isd increases ADM and increasing Ids increases WRM. Assuming an NFET with electron mobility about 20% lower than nominal NFET on the drain side, and about 20% higher on the source side, then Isd would be decreased by about 20% compared to a nominal NFET and Ids would be increased by about 20% compared to the nominal FET. The corresponding ADM would be greater than 5.8 sigma and WRM would be greater than about 7.2 sigma respectively. A 5.8 sigma ADM implies less than 0.007 stability fails per megabit, and the cell would be considered "stable" for general SRAM applications. A 7.2 sigma WRM would imply that write fails are "not possible" or about 0.6 write fails per trillion bit. In one example, the ADM and WRM crossing is adjusted to the normalized mobility of 1.0 using Vt adjustments which further optimizes the advantages of an asymmetrical NFET pass gate in an SRAM cell. For PFET pass gates, a similar plot to that of FIG. 8 would plot normalized hole mobility and the ADM and WRM crossing is adjusted to the normalized mobility of 1.0 using Vt adjustments which further optimizes the advantages of an asymmetrical PFET pass gate in an SRAM cell For SRAM cells having multiple ports, each input/output port may be implemented with asymmetrical pass gates. A 2-port SRAM cell, using FIG. 6 as an example, would include two pass gates (the drains) connected to node A and two pass gates (the drains) connected to node B. The gates of one pair of an A and a B node pass gate would be connected to a first wordline and the gates of the other pair of an A and a B node pass gate would be connected to a second wordline. The source of each of the four pass gates would be connected to different bitlines. A multi port SRAM cell is described in U.S. Pat. No. 6,341,083 to Wong and is hereby included by reference in its entirety.

Thus, the present invention allows optimization of both ADM and WRM in SRAM cells by the use of asymmetrical pass gates.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A static random access memory (SRAM) cell, comprising:
  a first p-channel field effect transistor (PFET) and a second PFET, the sources of said first and second PFETs connected to a high voltage terminal of a power source of a power supply, a drain of said first PFET connected to a first node, a drain of said second of second PFET connected to a second node, a gate of said first PFET connected to said second node and a gate of said second PFET connected to said first node;
  a first n-channel field effect transistor (NFET) and a second NFET, the sources of said first and second NFETs connected to a low voltage terminal of said power source, a drain of said first NFET connected to said first node, a drain of said second NFET connected to said second node, a gate of said first NFET connected to said second node and a gate of said second NFET connected to said first node; and
  a first field effect transistor (FET) pass gate and a second FET pass gate, a drain of said first FET pass gate connected to said first node and a drain of said second FET pass gate connected to said second node; a source of said first FET pass gate connected to a first bitline and a gate of said second FET pass gate connected to second bitline, gates of said first and second FET pass gates connected to a wordline, current conduction from said source to said drain of said first FET pass gate being different from current conduction from said drain to said source of said first FET pass gate and current conduction from said source to said drain of said second FET pass gate being different from current conduction from said drain to said source of said second FET pass gate.

2. The SRAM cell of claim 1, wherein said current conduction from said source to said drain of said first FET pass gate is less than said current conduction from said drain to said source of said first FET pass gate and said current conduction from said source to said drain of said second FET pass gate is less than said current conduction from said drain to said source of said second FET pass gate.

3. The SRAM cell of claim 1, wherein said first and second FET pass gates are NFETs.

4. The SRAM cell of claim 3, wherein an electron mobility of said drains of said first and second FET pass gates is less than an electron mobility of said sources of said first and second FET pass gates.

5. The SRAM cell of claim 1, wherein said first and second FET pass gates are PFETs.

6. The SRAM cell of claim 4, wherein a hole mobility of said drains of said first and second FET pass gates is greater than a hole mobility of said sources of said first and second FET pass gates.

7. The SRAM cell of claim 1, wherein said drains of said first and second FET pass gates are under compressive stress.

8. The SRAM cell of claim 1, wherein said sources of said first and second FET pass gates are under tensile stress.

9. The SRAM cell of claim 1, wherein said first and second FET pass gates each include a buried dielectric layer extending under said drains of said first and second FET pass gates but not under said sources of first and second FET pass gates.

10. The SRAM cell of claim 1, wherein said drains of said first and second FET pass gates include germanium.

11. The SRAM cell of claim 1, further including:
a third field effect transistor (FET) pass gate and a fourth FET pass gate, a drain of said third FET pass gate connected to said first node and a drain of said second FET pass gate connected to said second node; a source of said third FET pass gate connected to a third bitline and a gate of said fourth FET pass gate connected to fourth bitline, gates of said third and fourth FET pass gates connected to an additional wordline, current conduction from said source to said drain of said third FET pass gate being different from current conduction from said drain to said source of said third FET pass gate and current conduction from said source to said drain of said fourth FET pass gate being different from current conduction from said drain to said source of said fourth FET pass gate.

12. The SRAM cell of claim 11, wherein said current conduction from said source to said drain of said third FET pass gate is less than said current conduction from said drain to said source of said third FET pass gate and said current conduction from said source to said drain of said fourth FET pass gate is less than said current conduction from said drain to said source of said fourth FET pass gate.

13. A method of reducing access disturb margin in a static random access memory (SRAM) cell, comprising:
forming a first p-channel field effect transistor (PFET) and a second PFET, the sources of said first and second PFETs connected to a high voltage terminal of a power source of a power supply, a drain of said first PFET connected to a first node, a drain of said second of second PFET connected to a second node, a gate of said first PFET connected to said second node and a gate of said second PFET connected to said first node;
forming a first n-channel field effect transistor (NFET) and a second NFET, the sources of said first and second NFETs connected to a low voltage terminal of said power source, a drain of said first NFET connected to said first node, a drain of said second NFET connected to said second node, a gate of said first NFET connected to said second node and a gate of said second NFET connected to said first node;
forming a first field effect transistor (FET) pass gate and a second FET pass gate, a drain of said first FET pass gate connected to said first node and a drain of said second FET pass gate connected to said second node; a source of said first FET pass gate connected to a first bitline and a gate of said second FET pass gate connected to second bitline, gates of said first and second FET pass gates connected to a wordline; and
adjusting current conduction from said drain to said source of said first FET pass gate to be greater than current conduction from said source to said drain of said first FET pass gate and adjusting current conduction from said drain to said source of said second FET pass gate to be greater than current conduction from said source to said drain of said second FET pass gate.

14. The method of claim 13, wherein said adjusting current conduction from said drain to said source of said first FET pass gate includes forming a buried dielectric layer extending under said drain of said first FET pass gate but not under said source of said first FET pass gate and said adjusting current conduction from said drain to said source of said second FET pass gate includes forming a buried dielectric layer extending under said drain of said second FET pass gate but not under said source of second FET pass gate.

15. The method of claim 13, wherein said adjusting current conduction from said drain to said source of said first FET pass gate includes introducing germanium into said drain of said first FET pass gate and said adjusting current conduction from said drain to said source of said second FET pass gate includes introducing germanium into said drain of said second FET pass gate.

16. The method of claim 13, wherein:
said adjusting current conduction from said drain to said source of said first FET pass gate includes forming a buried dielectric layer extending under said drain of said first FET pass gate but not under said source of first FET pass gate and introducing germanium into said drain of said first FET pass gate; and
said adjusting current conduction from said drain to said source of said second FET pass gate includes forming a buried dielectric layer extending under said drain of said second FET pass gate but not under said source of second FET pass gate and introducing germanium into said drain of said second FET pass gate.

17. The method of claim 13, further including:
adjusting a threshold voltage of said first FET pass gate and adjusting a threshold voltage of said second FET pass gate.

18. The method of claim 17, wherein said adjusting said threshold voltage of said first and second FET pass gates includes performing a threshold voltage adjustment ion implantation to increase said threshold voltage above a nominal value of otherwise identical FETs without said ion implantation when said first and second FET pass gates are n-channel FETs and to decrease said threshold voltage below a nominal value of otherwise identical FETs without said ion implantation when said first and second FET pass gates are p-channel FETs.

19. The method of claim 13, wherein said adjusting current conduction from said drain to said source of said first and second FET pass gates decreases electron mobility in said drain relative to electron mobility in said source when said first and second FET pass gates are n-channel FETs and increases hole mobility in said drain relative to hole mobility in said source when said first and second FET pass gates are p-channel FETs.

20. The method of claim 13, further including:
forming a third field effect transistor (FET) pass gate and a fourth FET pass gate, a drain of said third FET pass gate connected to said first node and a drain of said second FET pass gate connected to said second node; a source of said third FET pass gate connected to a third bitline and a gate of said fourth FET pass gate connected to fourth bitline, gates of said third and fourth FET pass gates connected to an additional wordline; and
adjusting current conduction from said drain to said source of said third FET pass gate to be greater than current conduction from said source to said drain of said third FET pass gate and adjusting current conduction from said drain to said source of said fourth FET pass gate to be greater than from current conduction from said source to said drain of said fourth FET pass gate.

* * * * *